(12) United States Patent
Hwang et al.

(10) Patent No.: US 12,599,040 B2
(45) Date of Patent: Apr. 7, 2026

(54) THREE-DIMENSIONAL INTEGRATED CIRCUIT STRUCTURE AND A METHOD OF FABRICATING THE SAME

(71) Applicant: SAMSUNG ELECTRONICS CO., LTD., Suwon-si (KR)

(72) Inventors: Jegwan Hwang, Suwon-si (KR); Jihyung Kim, Seoul (KR); Jeong Hoon Ahn, Seongnam-si (KR); Jaehee Oh, Seongnam-si (KR); Shaofeng Ding, Suwon-si (KR); Won Ji Park, Suwon-si (KR); WooSeong Jang, Suwon-si (KR); Seokjun Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 719 days.

(21) Appl. No.: 17/862,496

(22) Filed: Jul. 12, 2022

(65) Prior Publication Data

US 2023/0154894 A1 May 18, 2023

(30) Foreign Application Priority Data

Nov. 18, 2021 (KR) ........................ 10-2021-0159836

(51) Int. Cl.
| | |
|---|---|
| *H01L 25/065* | (2023.01) |
| *H01L 23/00* | (2006.01) |
| *H01L 23/528* | (2006.01) |
| *H01L 25/00* | (2006.01) |
| *H01L 25/18* | (2023.01) |

(52) U.S. Cl.
CPC ...... *H01L 25/0657* (2013.01); *H01L 23/5286* (2013.01); *H01L 24/05* (2013.01);
(Continued)

(58) Field of Classification Search
None
See application file for complete search history.

(56) References Cited

U.S. PATENT DOCUMENTS

| | | | |
|---|---|---|---|
| 8,513,061 | B2 | 8/2013 | Lee et al. |
| 9,536,809 | B2 | 1/2017 | Batra et al. |

(Continued)

FOREIGN PATENT DOCUMENTS

| | | |
|---|---|---|
| KR | 10-2011-0134198 A | 12/2011 |
| KR | 10-2015-0066527 A | 6/2015 |
| TW | 202133444 A | 9/2021 |

*Primary Examiner* — Julio J Maldonado
*Assistant Examiner* — Pinaki Das
(74) *Attorney, Agent, or Firm* — Morgan, Lewis & Bockius LLP

(57) ABSTRACT

A three-dimensional integrated circuit structure including: a first die including a first power delivery network, a first substrate, a first device layer, and a first metal layer; a second die on the first die, the second die including a second power delivery network, a second substrate, a second device layer, and a second metal layer; a first through electrode extending from the first power delivery network to a top surface of the first metal layer; and a first bump on the first through electrode, the second power delivery network including: lower lines to transfer power to the second device layer; and a pad connected to a lowermost one of the lower lines, the first bump is interposed between and connects the first through electrode and the pad, and the first power delivery network is connected to the second power delivery network through the first bump and the first through electrode.

19 Claims, 14 Drawing Sheets

(52) U.S. Cl.
CPC .............. *H01L 24/13* (2013.01); *H01L 24/16* (2013.01); *H01L 25/50* (2013.01); *H01L 24/06* (2013.01); *H01L 24/17* (2013.01); *H01L 24/73* (2013.01); *H01L 25/18* (2013.01); *H01L 2224/05567* (2013.01); *H01L 2224/06181* (2013.01); *H01L 2224/13025* (2013.01); *H01L 2224/16145* (2013.01); *H01L 2224/16225* (2013.01); *H01L 2224/17181* (2013.01); *H01L 2224/73257* (2013.01); *H01L 2225/0651* (2013.01); *H01L 2225/06513* (2013.01); *H01L 2225/06517* (2013.01); *H01L 2225/06544* (2013.01); *H01L 2225/06565* (2013.01)

(56) References Cited

U.S. PATENT DOCUMENTS 9,654,004 B1  5/2017  Deligianni et al.

| 9,741,691 | B2 | 8/2017 | Lim et al. | |
| 10,128,301 | B2 | 11/2018 | Umebayashi et al. | |
| 10,950,546 | B1 | 3/2021 | Doornbos | |
| 10,978,348 | B2 | 4/2021 | Delacruz et al. | |
| 11,041,211 | B2 | 6/2021 | Jain | |
| 2002/0020862 | A1 | 2/2002 | Livengood et al. | |
| 2009/0160050 | A1* | 6/2009 | Miyakawa | H01L 21/76898 257/737 |
| 2010/0001379 | A1 | 1/2010 | Lee et al. | |
| 2010/0252934 | A1* | 10/2010 | Law | H01L 23/49827 257/E21.597 |
| 2011/0298130 | A1 | 12/2011 | Kang | |
| 2012/0238069 | A1 | 9/2012 | Voldman | |
| 2012/0292777 | A1 | 11/2012 | Lotz | |
| 2016/0322331 | A1* | 11/2016 | Lim | H01L 25/50 |
| 2020/0373331 | A1 | 11/2020 | Kim et al. | |
| 2021/0118805 | A1 | 4/2021 | Sio et al. | |
| 2021/0143127 | A1 | 5/2021 | Jain et al. | |
| 2023/0060355 | A1* | 3/2023 | Shih | H01L 24/05 |

* cited by examiner

THREE-DIMENSIONAL INTEGRATED CIRCUIT STRUCTURE AND A METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0159836 filed on Nov. 18, 2021 in the Korean Intellectual Property Office, the disclosure of which is incorporated by reference herein in its entirety.

TECHNICAL FIELD

The present inventive concept relates to a three-dimensional integrated circuit structure and a method of fabricating the same, and more particularly, to a three-dimensional integrated circuit structure with improved electrical properties and a method of fabricating the same.

DISCUSSION OF RELATED ART

Semiconductor devices or integrated circuit with characteristics such as, high capacity, thinness, and small size, are in constant demand. As such, a variety of packaging techniques have been developed. A semiconductor package is a metal, plastic, glass or ceramic casing containing one or more discrete semiconductor devices or integrated circuits. A semiconductor package is typically configured such that a semiconductor chip is mounted on a printed circuit board (PCB) and bonding wires or bumps are used to electrically connect the semiconductor chip to the PCB.

SUMMARY

Some embodiments of the present inventive concept provide a three-dimensional integrated circuit structure with improved electrical properties and increased reliability.

Some embodiments of the present inventive concept provide a method of fabricating a three-dimensional integrated circuit structure with improved electrical properties and increased reliability.

According to some embodiments of the present inventive concept, a three-dimensional integrated circuit structure includes: a first die including a first power delivery network, a first substrate, a first device layer, and a first metal layer that are sequentially stacked; a second die on the first die, the second die including a second power delivery network, a second substrate, a second device layer, and a second metal layer that are sequentially stacked; a first through electrode that extends from the first power delivery network to a top surface of the first metal layer; and a first bump on the first through electrode, wherein the second power delivery network includes: a plurality of lower lines is configured to transfer a power to the second device layer; and a pad connected to a lowermost one of the lower lines, wherein the first bump is interposed between and connects the first through electrode and the pad, and wherein the first power delivery network is electrically connected to the second power delivery network through the first bump and the first through electrode.

According to some embodiments of the present inventive concept, a three-dimensional integrated circuit structure includes: a first die including a first power delivery network, a first substrate, a first device layer, and a first metal layer that are sequentially stacked; a second die on the first die, the second die including a second power delivery network, a second substrate, a second device layer, and a second metal layer that are sequentially stacked; a through electrode that extends from the first power delivery network to a top surface of the first metal layer; and a through contact that extends from the second power delivery network to the second metal layer, wherein the through electrode electrically connects the first power delivery network to the second power delivery network, wherein the through contact electrically connects the first metal layer to the second metal layer, wherein a diameter of a lower portion of the through electrode is greater than a diameter of an upper portion of the through electrode, and wherein a diameter of a lower portion of the through contact is greater than a diameter of an upper portion of the through contact.

According to some embodiments of the present inventive concept, a three-dimensional integrated circuit structure includes: a first power delivery network that includes a plurality of stacked first lower lines; a first semiconductor substrate on the first power delivery network; a first device layer that includes a plurality of first transistors on the first semiconductor substrate; a first metal layer that includes a plurality of first wiring lines stacked on the first device layer; a first through via that electrically connects the first power delivery network to the first device layer; a through electrode that extends from the first power delivery network to a top surface of the first metal layer; a second power delivery network on the first metal layer, the second power delivery network including a plurality of stacked second lower lines; a second semiconductor substrate on the second power delivery network; a second device layer that includes a plurality of second transistors on the second semiconductor substrate; a second metal layer that includes a plurality of second wiring lines stacked on the second device layer; and a second through via that electrically connects the second power delivery network to the second device layer, wherein the second power delivery network is electrically connected to the through electrode, wherein a power applied to the first power delivery network is transferred via the through electrode to the second power delivery network, wherein the first power delivery network is configured to transfer the power to the first device layer, and wherein the second power delivery network is configured to transfer the power to the second device layer.

BRIEF DESCRIPTION OF THE DRAWINGS

FIG. 2 illustrates an enlarged cross-sectional view of section M shown in FIG. 1, showing a three-dimensional integrated circuit structure according to some embodiments of the present inventive concept.

FIGS. 11, 12 and 13 illustrate enlarged cross-sectional views of section M shown in FIG. 1, showing a three-dimensional integrated circuit structure according to some embodiments of the present inventive concept.

DETAILED DESCRIPTION OF THE EMBODIMENTS

Figure 1:
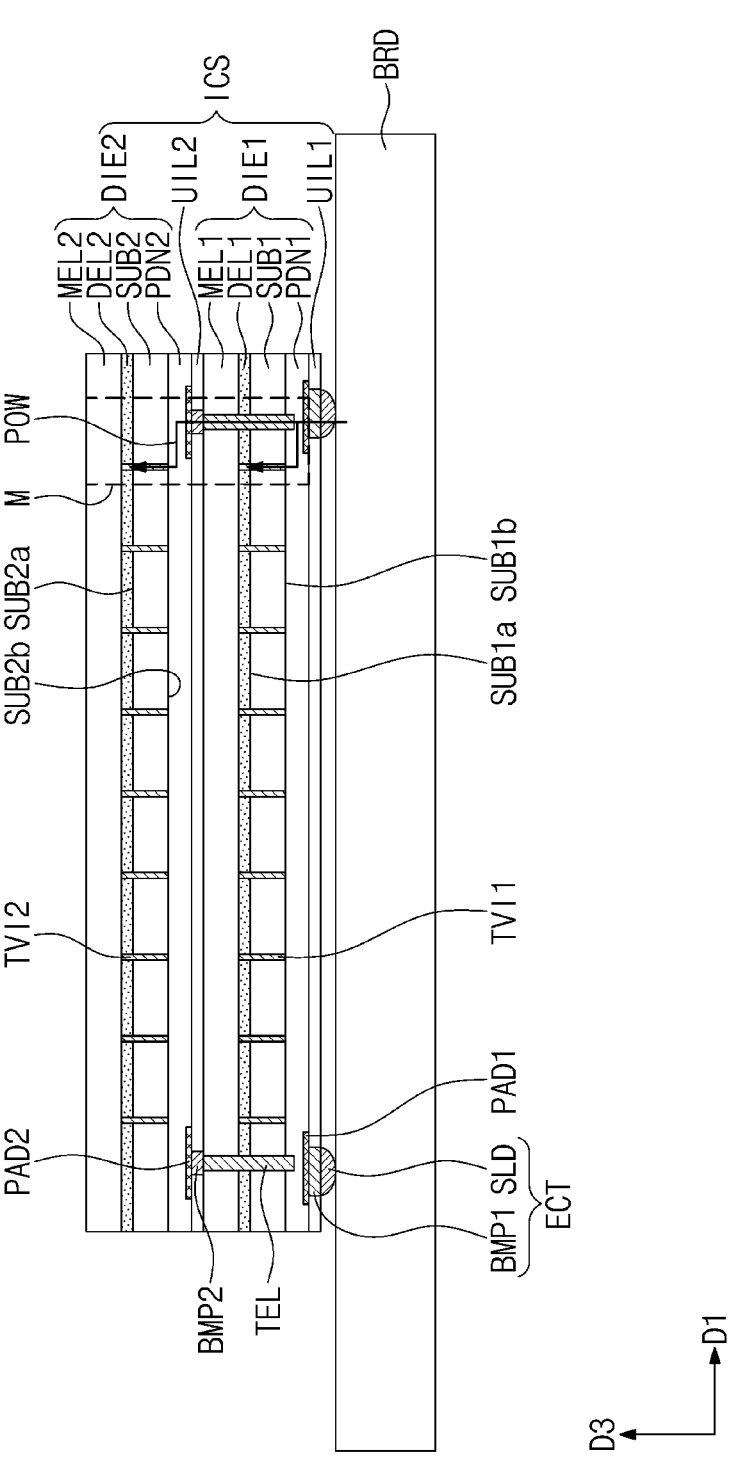
FIG. 1 illustrates a cross-sectional view showing a semiconductor package according to some embodiments of the present inventive concept.
Figure 2:
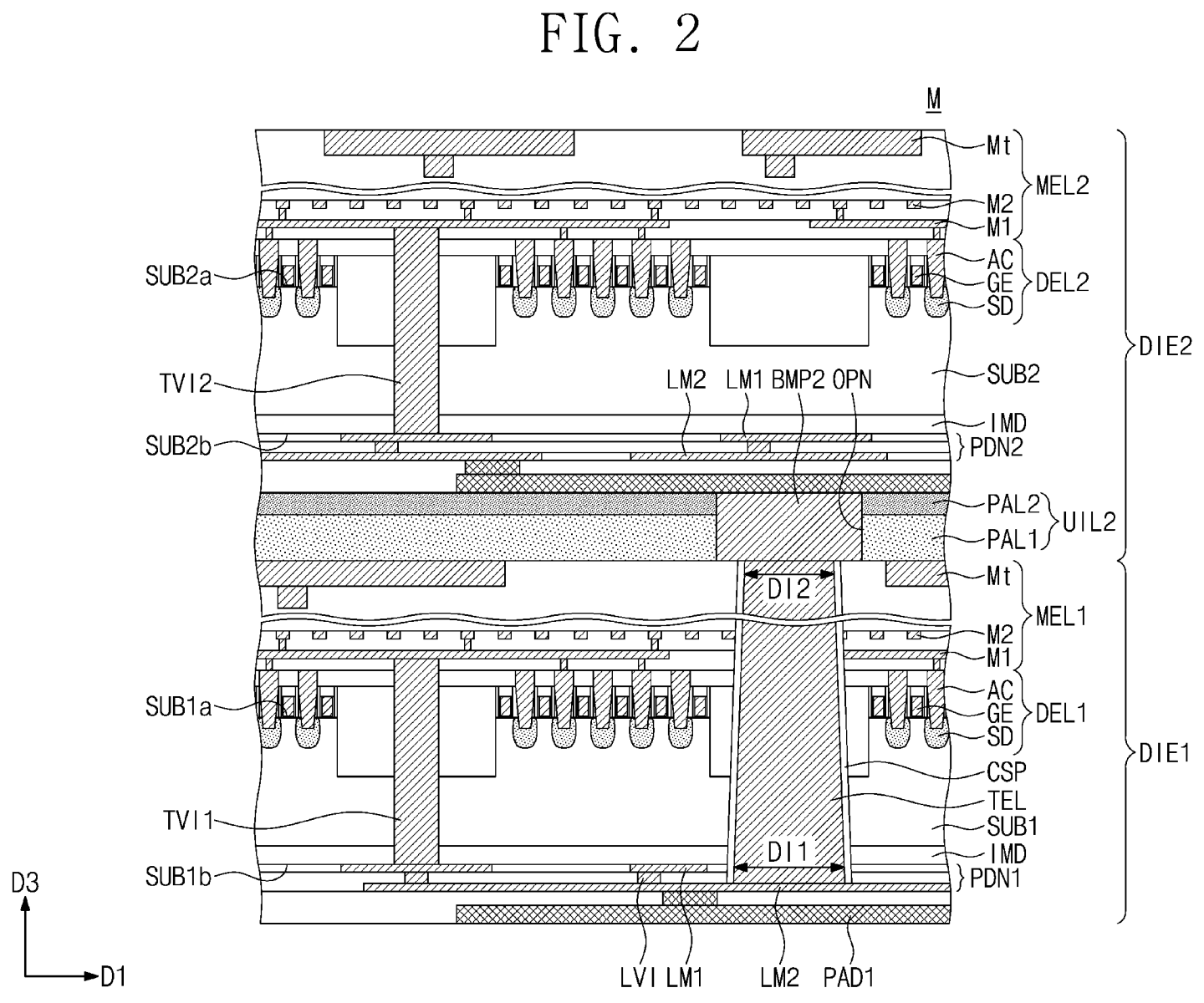

FIG. 1 illustrates a cross-sectional view showing a semiconductor package according to some embodiments of the present inventive concept. FIG. 2 illustrates an enlarged cross-sectional view of section M shown in FIG. 1, showing a three-dimensional integrated circuit structure according to some embodiments of the present inventive concept.

Referring to FIG. 1, a three-dimensional integrated circuit structure ICS may be provided on a package substrate BRD. In some embodiments of the present inventive concept, the three-dimensional integrated circuit structure ICS may include first and second dies DIE1 and DIE2. The second die DIE2 may be stacked on the first die DIE1.

Each of the first and second dies DIE1 and DIE2 may include a logic chip, a memory chip, or a radio-frequency (RF) chip. The logic chip may include a central processing unit (CPU), and the memory chip may include at least one selected from static random access memory (SRAM) cells, dynamic RAM (DRAM) cell, magnetoresistive RAM (MRAM) cells, and Flash memory cells.

External connection members ECT may be provided between the three-dimensional integrated circuit structure ICS and the package substrate BRD. Each of the external connection members ECT may include a first bump BMP1 connected to a first pad PAD1 of the first die DIE1, and may also include a solder pattern SLD on the first bump BMP1. The three-dimensional integrated circuit structure ICS may be connected through the external connection members ECT to the package substrate BRD. A power may be applied from the package substrate BRD through the external connection members ECT to the three-dimensional integrated circuit structure ICS.

A first dielectric structure UIL1 may be provided on a first power delivery network PDN1. The first dielectric structure UIL1 may cover the first bump BMP1. An under-fill layer may fill a space between the three-dimensional integrated circuit structure ICS and the package substrate BRD.

The first die DIE1 may include a first substrate SUB1. The first substrate SUB1 may be a semiconductor substrate including silicon (Si), germanium (Ge), and silicon-germanium (SiGe). The first substrate SUB1 may have a first surface SUB1a and a second surface SUB1b. The second surface SUB1b may be opposite to the first surface SUB1a. For example, the first surface SUB1a may be a top surface of the first substrate SUB1, and the second surface SUB1b may be a bottom surface of the first substrate SUB1.

The first die DIE1 may include the first power delivery network PDN1 on the second surface SUB1b of the first substrate SUB1. The first power delivery network PDN1 may provide a first device layer DEL1 of the first die DIE1 with a power POW transferred from the external connection member ECT. The first power delivery network PDN1 may include a wiring network for applying the power POW to the first device layer DEL1. The wiring network of the first power delivery network PDN1 may provide the first device layer DEL1 with not only the power POW but also a signal. For example, a power delivery network according to some embodiments of the present inventive concept may include a wiring network for delivering powers and signals.

The first pad PAD1 may be provided between the first power delivery network PDN1 and the external connection member ECT. The first pad PAD1 may be electrically connected to the first power delivery network PDN1. An interlayer dielectric layer IMD may be interposed between the first power delivery network PDN1 and the first substrate SUB1. The interlayer dielectric layer IMD may insulate the first power delivery network PDN1 from the first substrate SUB1.

The first die DIE1 may include the first device layer DEL1 on the first surface SUB1a of the first substrate SUB1. The first device layer DEL1 may include one or more of passive and active elements. For example, the passive and/or active elements of the first device layer DEL1 may include one or more of transistors, capacitors, and inductors. The passive and/or active elements of the first device layer DEL1 may constitute at least one of logic circuits, peripheral circuits, radio frequency (RF) circuits, and complementary metal-oxide semiconductor (CMOS) circuits.

The first die DIE1 may include a first metal layer MEL1 on the first device layer DEL1. The first metal layer MEL1 may be electrically connected to the first device layer DEL1. As discussed below, the first metal layer MEL1 may include a plurality of stacked metal layers.

A plurality of first through vias TVI1 that penetrate the first substrate SUB1 may be provided between the first power delivery network PDN1 and the first device layer DEL1. In some embodiments of the present inventive concept, the first through vias TVI1 may vertically extend from the first power delivery network PDN1 to the first metal layer MEL1. In some embodiments of the present inventive concept, the first through vias TVI1 may vertically extend from the first power delivery network PDN1 into the first metal layer MEL1. The first power delivery network PDN1 may be electrically connected through the first through vias TVI1 to the first device layer DEL1.

The first die DIE1 may include a plurality of through electrodes TEL that extend from the first power delivery network PDN1 to a top surface of the first metal layer MEL1. The through electrode TEL may vertically extend to penetrate the first substrate SUB1, the first device layer DEL1, and the first metal layer MEL1. The through electrode TEL may receive a signal and the power POW from the first power delivery network PDN1.

A plurality of second bumps BMP2 may be provided between the first die DIE1 and the second die DIE2. The second bumps BMP2 may be correspondingly provided on top surfaces of the through electrodes TEL. The second bump BMP2 may be connected to a second pad PAD2 of the second die DIE2 to electrically connect the through electrode TEL to the second die DIE2.

The second die DIE2 may include a second substrate SUB2. The second substrate SUB2 may have a first surface SUB2a and a second surface SUB2b. The second surface SUB2b may be opposite to the first surface SUB2a.

The second die DIE2 may include a second power delivery network PDN2 on the second surface SUB2b of the second substrate SUB2, and may also include a second device layer DEL2 on the first surface SUB2a of the second substrate SUB2. An interlayer dielectric layer IMD may be interposed between the second power delivery network PDN2 and the second substrate SUB2. The second die DIE2 may further include a second metal layer MEL2 on the second device layer DEL2. A description of the second power delivery network PDN2, the second device layer DEL2, and the second metal layer MEL2 may be substantially the same as or similar to that of the first power delivery network PDN1, the first device layer DEL1, and the first metal layer MEL1, respectively.

A plurality of second through vias TVI2 that penetrate the second substrate SUB2 may be provided between the second power delivery network PDN2 and the second device layer DEL2. The second power delivery network PDN2 may be electrically connected through the second through vias TVI2 to the second device layer DEL2.

The power POW may be applied from the first die DIE1 to the second power delivery network PDN2 through the through electrode TEL and the second bump BMP2. The power POW applied to the second power delivery network PDN2 may be directly transferred through the second through via TVI2 to the second device layer DEL2.

As shown in FIG. 1, the power POW, which is applied from the external connection member ECT to the three-dimensional integrated circuit structure ICS, may be vertically transferred via the through electrode TEL. The power POW and a signal may be directly transferred to the first device layer DEL1 and the second device layer DEL2 through the first power delivery network PDN1 and the second power delivery network PDN2 that are respectively connected to lower and upper portions of the through electrode TEL.

A three-dimensional integrated circuit structure ICS according to some embodiments of the present inventive concept may be configured to transfer the power POW and a signal along the shortest path (or vertical path) to the first device layer DEL1 of the first die DIE1 and the second device layer DEL2 of the second die DIE2. Accordingly, the three-dimensional integrated circuit structure ICS may improve in power delivery efficiency and increase in electrical properties.

The following will describe in detail the first die DIE1 with reference to FIGS. 1 and 2. The first power delivery network PDN1 may be provided on the second surface SUB1*b* of the first substrate SUB1. The first power delivery network PDN1 may include first lower lines LM1 on the second surface SUB1*b* and second lower lines LM2 underneath the first lower lines LM1. For example, the second lower line LM2 may be located at a bottom of the first power delivery network PDN1. A lower via LVI may be provided between the first and second lower lines LM1 and LM2. The first and second lower lines LM1 and LM2 may constitute a wiring network that distributes a power and a signal that are input and applies the power and the signal to the first device layer DEL1.

The first pad PAD1 may be provided below the second lower line LM2. As illustrated in FIG. 1, the external connection member ECT may be provided on the first pad PAD1. A power may be input to first power delivery network PDN1 through the external connection member ECT and the first pad PAD1.

The first device layer DEL1 may be provided on the first surface SUB1*a* of the first substrate SUB1. The first device layer DEL1 may include a front-end-of-line (FEOL) layer formed through an FEOL process for semiconductor fabrication. For example, the first device layer DEL1 may include a plurality of source/drain patterns SD provided on an upper portion of the first substrate SUB1. The upper portion of the first substrate SUB1 may include a first active region. The first device layer DEL1 may include a plurality of gate electrodes GE on the first active region. For example, a plurality of gate electrodes GE may be provided on the first surface SUB1*a* of the first substrate SUB1. Each of the gate electrodes GE may be interposed between a pair of neighboring source/drain patterns SD. The first device layer DEL1 may include a plurality of transistors constituted by the gate electrodes GE and the source/drain patterns SD.

In some embodiments of the present inventive concept, the first device layer DEL1 may include fin-shaped field effect transistors, also referred to as FinFETs. Is some embodiments of the present inventive concept, the first device layer DEL1 may include three-dimensional field effect transistors, also referred to as gate-all-around FETs (GAAFETs) or multi-bridge channel FETs (MBCFETS), in which a gate surrounds a channel.

The first device layer DEL1 may further include a plurality of active contacts AC connected to corresponding source/drain patterns SD. The first device layer DEL1 may further include a plurality of gate contacts connected to corresponding gate electrodes GE.

The first metal layer MEL1 may be provided on the first device layer DEL1. The first metal layer MEL1 may include a back-end-of-line (BEOL) layer formed through a BEOL process for semiconductor fabrication. For example, the first metal layer MEL1 may include a plurality of wiring lines M1, M2, . . . , and Mt that are sequentially stacked. For example, first wiring lines M1 may be provided at bottom of the first metal layer MEL1. The first wiring lines M1 may be connected through vias to the active contacts AC of the first device layer DEL1.

Second wiring lines M2 may be provided on the first wiring lines M1. The second wiring lines M2 may be connected through vias to the first wiring lines M1. As shown in FIG. 2, not all of the second wiring lines M2 are connected to the first wiring lines M1 with the through vias. Uppermost wiring lines Mt may be provided at top of the first metal layer MEL1. A plurality of wiring lines may be stacked between the second wiring line M2 and the uppermost wiring line Mt, and no limitation is imposed on the number of the stacked wiring lines between the second wiring line M2 and the uppermost wiring line Mt. Each of the wiring lines M1, M2, . . . , and Mt of the first metal layer MEL1 may include at least one metal selected from aluminum, copper, tungsten, molybdenum, and cobalt.

The first through via TVI1 may extend from the first lower line LM1 of the first power delivery network PDN1 to the first wiring line M1 of the first metal layer MEL1. The first through via TVI1 may penetrate the first substrate SUB1 to vertically connect the first lower line LM1 to the first wiring line M1.

The first wiring line M1 may be electrically connected to the source/drain pattern SD through the via and the active contact AC that are provided below the first wiring line M1. A power and a signal may be transferred from the first power delivery network PDN1 via the first through via TVI1 and the first wiring line M1 to a transistor of the first device layer DEL1.

The through electrode TEL may extend from the second lower line LM2 of the first power delivery network PDN1 to the second bump BMP2 on the first metal layer MEL1. The through electrode TEL may directly contact the second lower line LM2 and the second bump BMP2. The through electrode TEL may penetrate the first substrate SUB1, the first device layer DEL1, and the first metal layer MEL1 to vertically connect the second lower line LM2 to the second bump BMP2. A power may be transferred from the first power delivery network PDN1 vertically through the first die DIE1 to the second bump BMP2.

The through electrode TEL may have a diameter greater than that of the first through via TVI1. The diameter of the through electrode TEL may decrease in a direction from lower toward upper portions of the through electrode TEL. The lower portion of the through electrode TEL may be provided in the first power delivery network PDN1 and the upper portion of the through electrode TEL may be adjacent to the upper surface of the first die DIE1. For example, the lower portion of the through electrode TEL in the first power delivery network PDN1 may have a first diameter DI1. The upper portion of the through electrode TEL in the first metal layer MEL1 may have a second diameter DI2. The second diameter DI2 may be less than the first diameter DI1.

A dielectric spacer CSP may be provided on a sidewall of the through electrode TEL. The dielectric spacer CSP may include a silicon-based dielectric material, such as silicon oxide or silicon nitride. The dielectric spacer CSP may insulate the sidewall of the through electrode TEL. A dielectric spacer may also be provided on and insulate a sidewall of the first through via TVI1.

A second dielectric structure UIL2 may be provided on the first metal layer MEL1. The second dielectric structure UIL2 may include a first dielectric layer PAL1 and a second dielectric layer PAL2 on the first dielectric layer PAL1. The second dielectric structure UIL2 may include an opening OPN that exposes the top surface of the through electrode TEL.

For example, the first dielectric layer PAL1 may include an inorganic dielectric layer, such as a silicon nitride layer, a silicon oxide layer, or a silicon oxynitride layer. The second dielectric layer PAL2 may include an organic polymer layer. For example, the organic polymer layer may include polyimide, fluorocarbon, resin, or synthetic rubber.

The second bump BMP2 may be provided in the opening OPN of the second dielectric structure UIL2. The second bump BMP2 may have a bottom surface in contact with the top surface of the through electrode TEL. The second bump BMP2 may have a top surface in contact with the second pad PAD2 of the second die DIE2. Thus, power may be transmitted via the second bump BMP2 from the through electrode TEL to the second pad PAD2.

The following will describe the second die DIE2. The second die DIE2 may be provided on the second dielectric structure UIL2. The second dielectric structure UIL2 and the second bump BMP2 may be interposed between the first die DIE1 and the second die DIE2.

The second power delivery network PDN2 may be provided on the second surface SUB2b of the second substrate SUB2. The second power delivery network PDN2 may include first lower lines LM1 on the second surface SUB2b of the second substrate SUB2 and second lower lines LM2 below the first lower lines LM1. The first and second lower lines LM1 and LM2 may constitute a wiring network that distributes a power and a signal that are input and applies the power and the signal to the second device layer DEL2.

The second pad PAD2 may be provided below the second lower line LM2. The second pad PAD2 may be in contact with the second bump BMP2 to electrically connect to the through electrode TEL of the first die DIE1. A power may be input to the second power delivery network PDN2 through the through electrode TEL and the second pad PAD2.

The second device layer DEL2 may be provided on the first surface SUB2a of the second substrate SUB2. The second device layer DEL2 may include an FEOL layer formed through an FEOL process for semiconductor fabrication. For example, the second device layer DEL2 may include a, plurality of source/drain patterns SD provided on an upper portion of the second substrate SUB2. The upper portion of the second substrate SUB2 may include a second active region. The second device layer DEL2 may include a plurality of gate electrodes GE on the second active region.

In some embodiments of the present inventive concept, the second device layer DEL2 may include fin-shaped field effect transistors, e.g., FinFETs. Is some embodiments of the present inventive concept, the second device layer DEL2 may include three-dimensional field effect transistors, GAAFETs or MBCFETS, in which a gate surrounds a channel.

The second device layer DEL2 may further include a plurality of active contacts AC connected to corresponding source/drain patterns SD. The second device layer DEL2 may further include a plurality of gate contacts connected to corresponding gate electrodes GE.

The second metal layer MEL2 may be provided on the second device layer DEL2. The second metal layer MEL2 may include a BEOL layer formed through a BEOL process for semiconductor fabrication. For example, the second metal layer MEL2 may include a plurality of wiring lines M1, M2, . . . , and Mt that are sequentially stacked. A detailed description of the second metal layer MEL2 may be substantially the same as or similar to that of the first metal layer MEL1 discussed above.

The second lower line LM2 of the second power delivery network PDN2 may be connected to the second pad PAD2, and as a result, a power may be transferred from the first die DIE1 via the through electrode TEL to the second power delivery network PDN2 of the second die DIE2.

The second through via TVI2 may be provided to extend from the first lower line LM1 of the second power delivery network PDN2 to the first wiring line M1 of the second metal layer MEL2. The second through via TVI2 may be directly connected to the first lower line LM1 of the second power delivery network PDN2 and the first wiring line M1 of the second metal layer MEL2. The second through via TVI2 may penetrate the second substrate SUB2 to vertically connect the first lower line LM1 to the first wiring line M1. Thus, a power and a signal may be transferred from the second power delivery network PDN2 via the second through via TVI2 and the first wiring line M1 to a transistor of the second device layer DEL2.

FIGS. 3 to 7 illustrate cross-sectional views of section M shown in FIG. 1, showing a method of fabricating a three-dimensional integrated circuit structure according to some embodiments of the present inventive concept.

Figure 3:
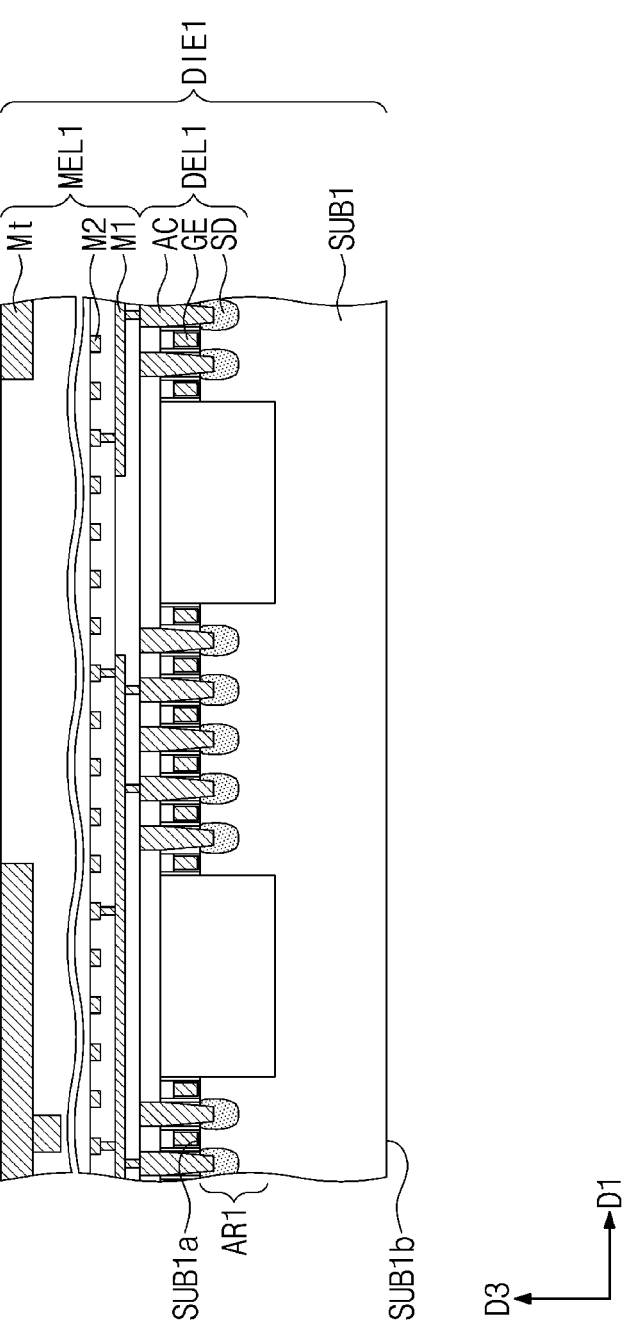
FIGS. 3, 4, 5, 6 and 7 illustrate cross-sectional views of section M shown in FIG. 1, showing a method of fabricating a three-dimensional integrated circuit structure according to some embodiments of the present inventive concept.

Referring to FIG. 3, an FEOL process for semiconductor fabrication may be performed to form a first device layer DEL1 on a first surface SUB1a of a first substrate SUB1. For example, a plurality of source/drain patterns SD may be formed in a first active region AR1 of the first substrate SUB1. A plurality of gate electrodes GE may be formed on the first active region AR1. A plurality of active contacts AC may be formed to connect to corresponding source/drain patterns SD.

A BEOL process for semiconductor fabrication may be performed to form a first metal layer MEL1 on the first device layer DEL1. For example, the formation of the first metal layer MEL1 may include sequentially forming (or stacking) a plurality of wiring lines M1, M2, . . . , and Mt. In some embodiments of the present inventive concept, an aluminum pad may be formed on an uppermost wiring line Mt on the first metal layer MEL1.

Figure 4:
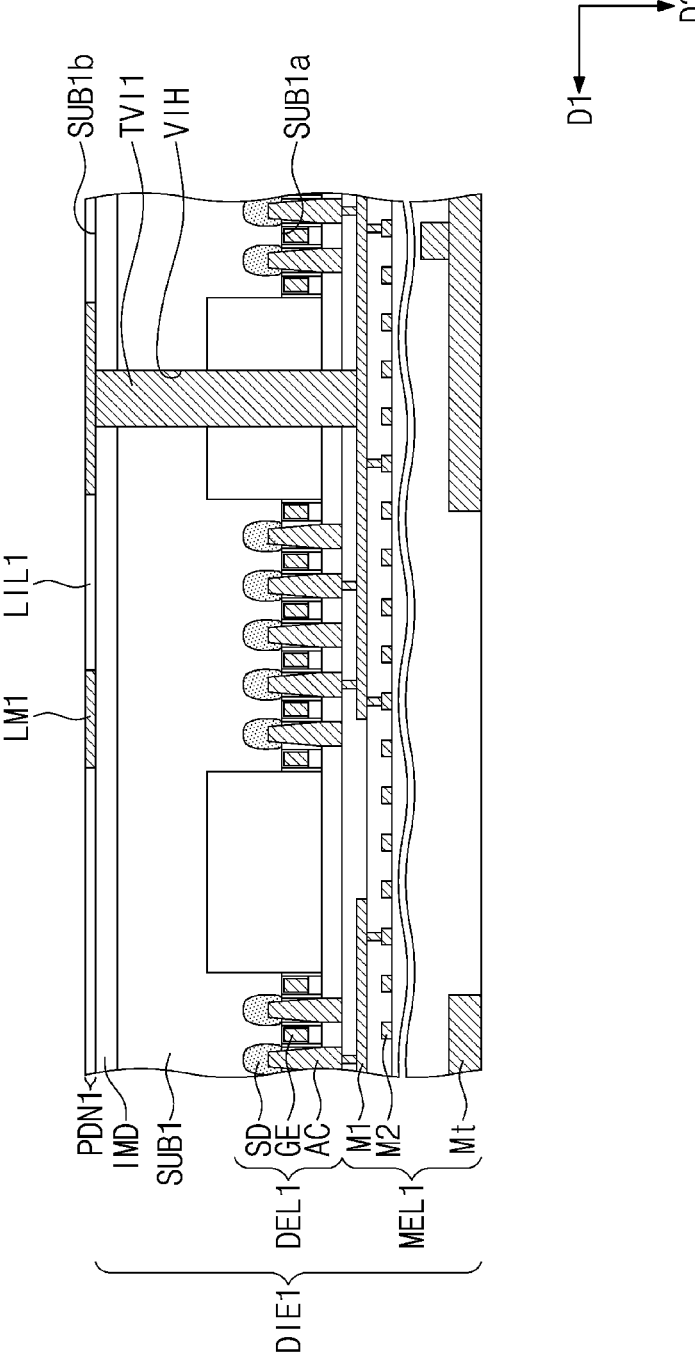

Referring to FIG. 4, the first die DIE1 that has undergone the BEOL process may be reversed (e.g., flipped) to expose a, 6 second surface SUB1$b$ of the first substrate SUB1. In some embodiments of the inventive concept, the second surface SUB1$b$ of the first substrate SUB1 may undergo a chemical mechanical polishing (CMP) process to reduce a thickness of the first substrate SUB1.

The second surface SUB1$b$ of the first substrate SUB1 may undergo an anisotropic etching process to form a through via hole VIH that penetrates the first substrate SUB1. The etching process may continue until the through via hole VIH exposes a first wiring line M1. The through via hole VIH may be filled with a conductive material to from a first through via TVI1. The first through via TVI1 may have a bottom surface in direct contact with the first wiring line M1. The first through via TVI1 may have a top surface that is exposed on the second surface SUB1$b$.

A semiconductor process may be performed to form a first power delivery network PDN1 on the second surface SUB1$b$ of the first substrate SUB1. For example, a first lower dielectric layer LIL1 may be formed on the second surface SUB1$b$. A plurality of first lower lines LM1 may be formed in the first lower dielectric layer LIL1. At least one of the first lower lines LM1 may be formed on the first through via TVI1 to contact the top surface of the first through via TVI1. For example, the first lower line LM1 may be electrically connected through the first through via TVI1 to the first wiring line M1. An interlayer dielectric layer IMD may be interposed between the first power delivery network PDN1 and the first substrate SUB1.

Figure 5:
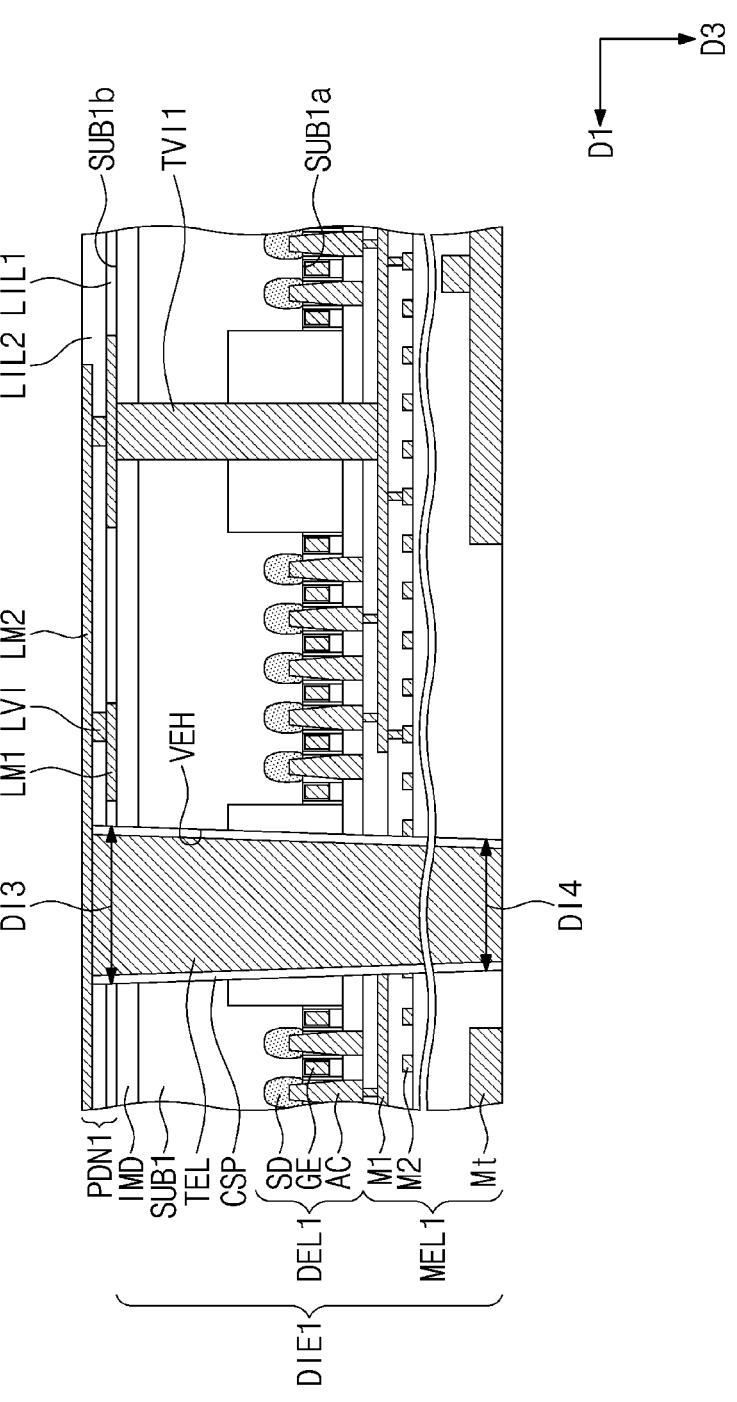

Referring to FIG. 5, a second lower dielectric layer LIL2 may be formed on the first lower dielectric layer LIL1. The second lower dielectric layer LIL2 may undergo an aniso-tropic etching process to form a through electrode hole VEH that penetrates the first substrate SUB1, the first device layer DEL1, and the first metal layer MEL1. The etching process may continue until the through electrode hole VEH completely penetrates the first metal layer MEL1.

The through electrode hole VEH may be formed to have a diameter that decreases in a third direction D3. For example, the through electrode hole VEH in the first power delivery network PDN1 may have a third diameter DI3, and the through electrode hole VEH in the first metal layer MEL1 may have a fourth diameter DI4. The third diameter DI3 may be greater than the fourth diameter DI4.

A dielectric spacer CSP may be conformally formed on an inner sidewall of the through electrode hole VEH. The dielectric spacer CSP may include a dielectric material. A through electrode TEL may be formed on the dielectric spacer CSP to completely fill the through electrode hole VEH. For example, a barrier layer and a conductive layer may be sequentially formed on the dielectric spacer CSP. The barrier layer may include a metal nitride layer or a combination of a metal layer and a metal nitride layer. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer. The metal layer may include at least one metal selected from aluminum, copper, tungsten, molybdenum, and cobalt.

A second lower line LM2 may be formed on the through electrode TEL. The second lower line LM2 may be formed in the second lower dielectric layer LIL2. The second lower line LM2 may be connected to the through electrode TEL. For example, the second lower line LM2 may directly contact the through electrode TEL. In addition, the second lower line LM2 may be connected to the first lower line LM1. For example, the second lower line LM2 may be connected to the first lower line LM1 through a first lower via LV1.

Figure 6:
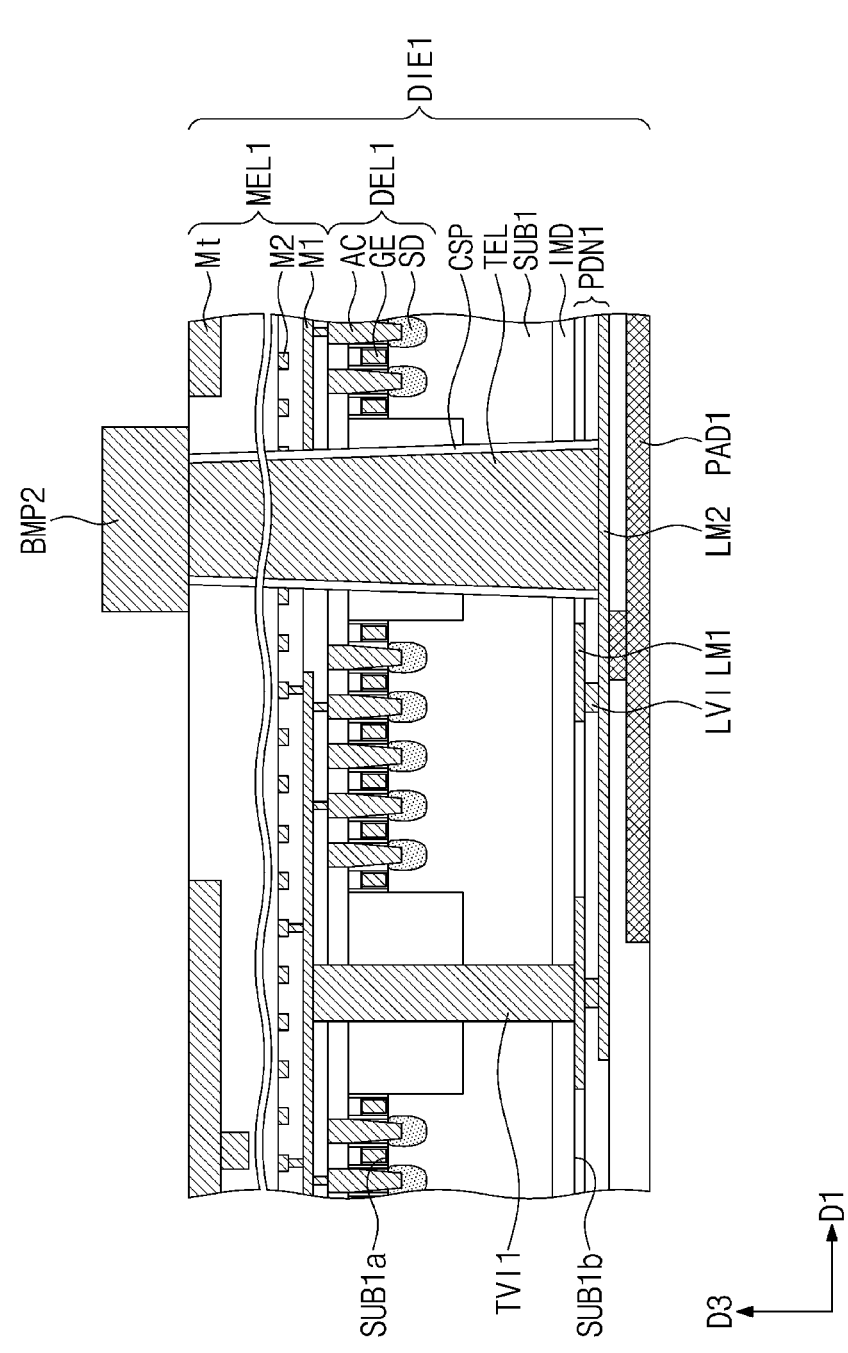

Referring to FIG. 6, the first die DIE1 may be reversed again to re-expose the first metal layer MEL1. A second bump BMP2 may be formed on an exposed top surface of the through electrode TEL.

For example, the second bump BMP2 may be formed through a post-fabrication process. The formation of the second bump BMP2 may include forming a seed pattern on the exposed top electrode TEL and performing a plating process on the seed pattern to form a conductive pattern. The seed pattern and the conductive pattern may constitute the second bump BMP2. For example, the seed pattern may include a conductive material, such as copper, titanium, and any alloy thereof. The conductive pattern may include copper.

Figure 7:
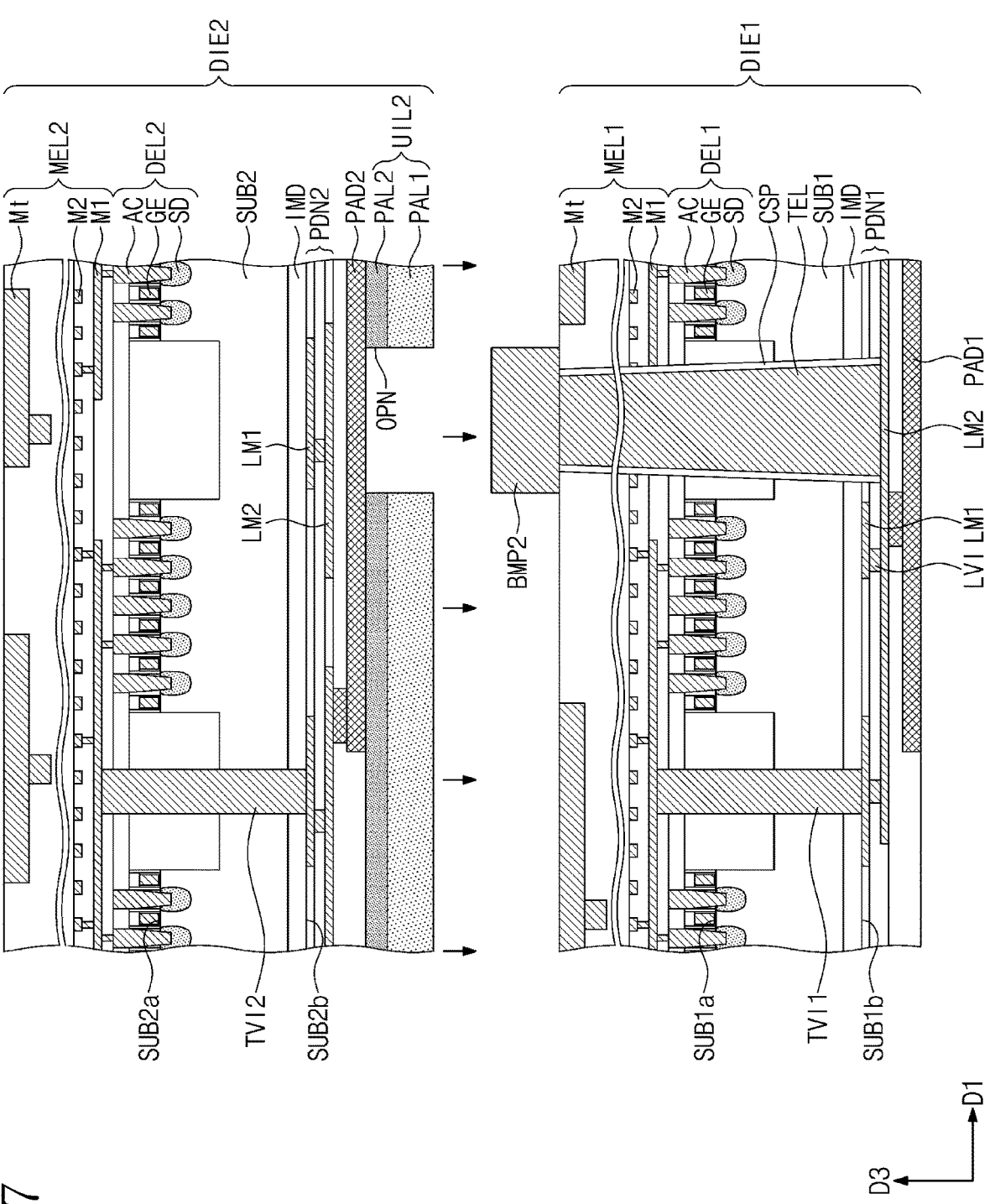

Referring to FIG. 7, a second die DIE2 may be formed. The formation of the second die DIE2 may be substantially the same as the formation of the first die DIE1 discussed above with reference to FIGS. 3 to 6. The formation of the through electrode TEL may be omitted in forming the second die DIE2.

A second dielectric structure UIL2 may be formed on a second power delivery network PDN2 of the second die DIE2. The second dielectric structure UIL2 may be pat-terned to form an opening OPN that exposes a second pad PAD2.

The second die DIE2 may be stacked on the first die DIE1, such that the first die DIE1 and the second die DIE2 may be bonded to each other. The second bump BMP2 may be provided in the opening OPN to thereby contact the second pad PAD2. As a result, the first power delivery network PDN1 of the first die DIE1 may be electrically connected via the through electrode TEL to the second power delivery network PDN2 of the second die DIE2.

In some embodiments of the present inventive concept, referring back to FIG. 1, a three-dimensional integrated circuit structure ICS including the first die DIE1 and the second die DIE2 may be mounted on a package substrate BRD. For example, an external connection member ECT may be formed on the first pad PAD1 of the three-dimen-sional integrated circuit structure ICS, and the three-dimen-sional integrated circuit structure ICS may be connected through the external connection member ECT to the package substrate BRD.

Figure 8:
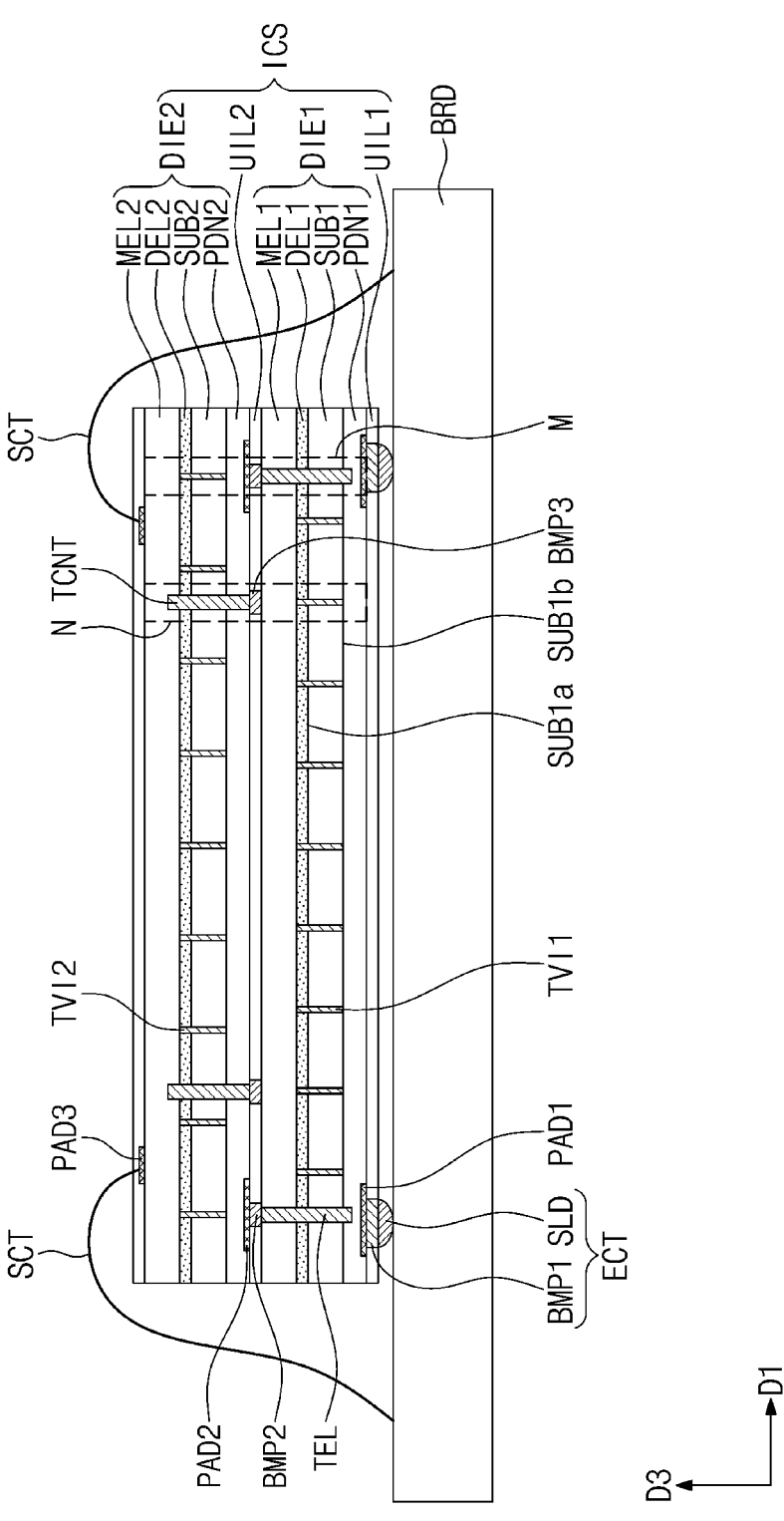
FIG. 8 illustrates a cross-sectional view showing a semiconductor package according to some embodiments of the present inventive concept.
Figure 9:
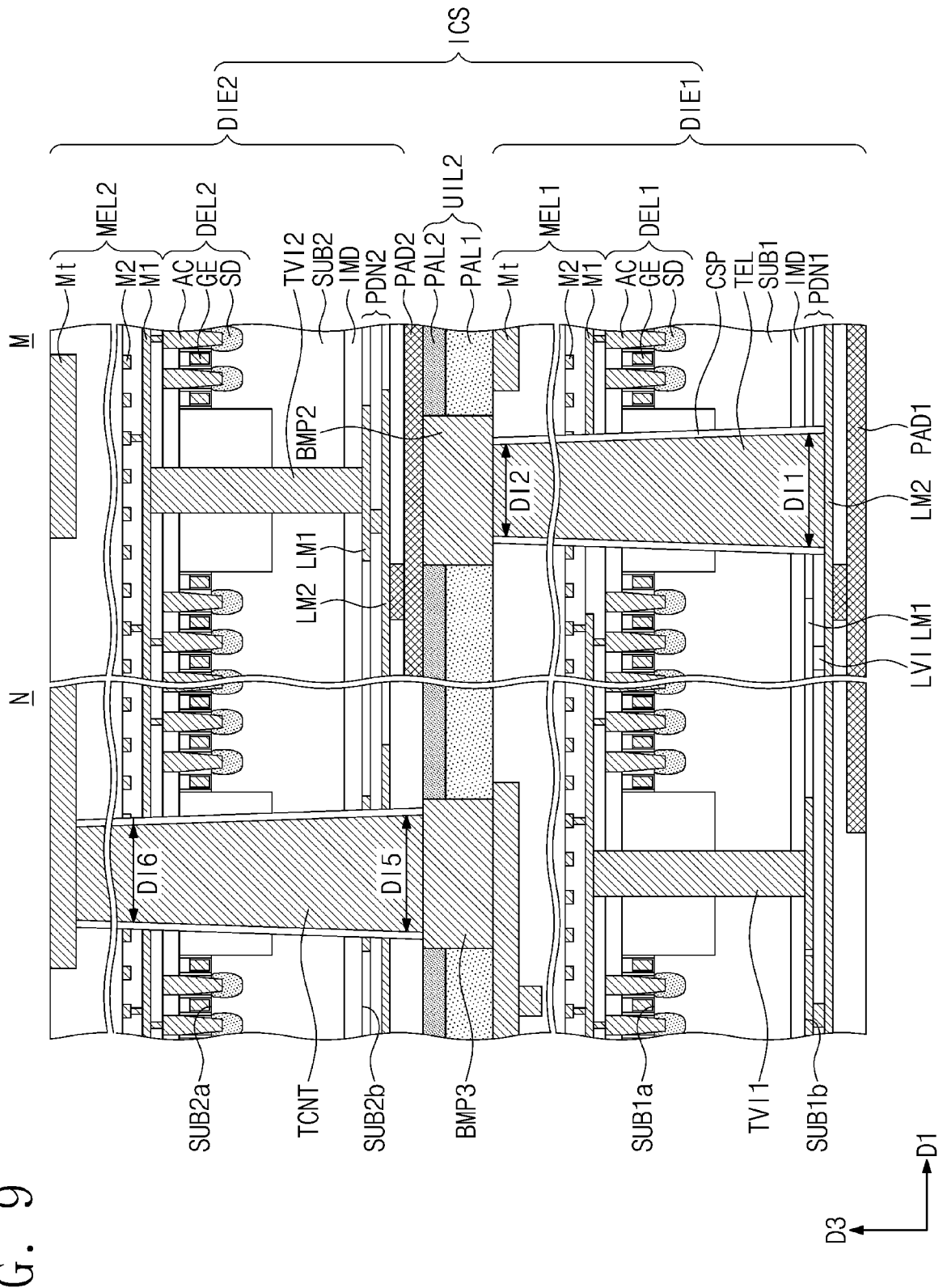
FIG. 9 illustrates enlarged cross-sectional view of sections N and M shown in FIG. 8, showing a three-dimensional integrated circuit structure according to some embodiments of the present inventive concept.

FIG. 8 illustrates a cross-sectional view showing a semi-conductor package according to some embodiments of the present inventive concept. FIG. 9 illustrates an enlarged cross-sectional view of sections N and M shown in FIG. 8, showing a three-dimensional integrated circuit structure according to some embodiments of the present inventive concept. In the embodiment that follows, a detailed descrip-tion of features repetitive to those discussed above with reference to FIGS. 1 and 2 may be omitted, and a difference thereof will mainly be discussed in detail.

Referring to FIG. 8, a third pad PAD3 may be provided at top of the three-dimensional integrated circuit structure ICS. The third pad PAD3 may be provided on the second metal layer MEL2 of the second die DIE2. The third pad PAD3 may be directly connected to the second metal layer MEL2.

A signal connection member SCT may be connected to connect the third pad PAD3 to the package substrate BRD. In some embodiments of the present inventive concept, the signal connection member SCT may include a conductive wire. The signal connection member SCT may provide an input or output between the package substrate BRD and the third pad PAD3.

The second die DIE2 may include a plurality of through contacts TCNT that extend from the second metal layer MEL2 to a bottom surface of the second power delivery network PDN2. The through contacts TCNT may extend in the third direction D3 to penetrate the second power delivery network PDN2, the second substrate SUB2, the second device layer DEL2, and a lower portion of the second metal layer MEL2. The through contact TCNT may receive a signal from the second metal layer MEL2.

A plurality of third bumps BMP3 may be provided between the first die DIE1 and the second die DIE2. The third bumps BMP3 may be correspondingly provided on bottom surfaces of the through contacts TCNT. The third bump BMP3 may be connected to the first metal layer MEL1 to electrically connect the through contact TCNT to the first die DIE1.

A signal may be transferred from the second metal layer MEL2 of the second die DIE2 through the third bump BMP3 and the through contact TCNT to the first metal layer MEL1 of the first die DIE1. Therefore, a signal may be exchanged and processed between the first die DIE1 and the second die DIE2.

The three-dimensional integrated circuit structure ICS according to some embodiments of the present inventive concept may be configured to transfer a signal along the shortest path between the first metal layer MEL1 of the first die DIE1 and the second metal layer MEL2 of the second die DIE2. Accordingly, the three-dimensional integrated circuit structure ICS may increase in signal processing speed and electrical properties.

The first die DIE1 and the second die DIE2 will be discussed in detail with reference to FIGS. 8 and 9. The through contact TCNT may be provided to vertically extend from the uppermost wiring line Mt of the second metal layer MEL2 to the third bump BMP3 between the first die DIE1 and the second die DIE2.

The through contact TCNT may penetrate the second power delivery network PDN2, the second substrate SUB2, and the second device layer DEL2 to vertically connect the second metal layer MEL2 to the third bump BMP3. For example, a signal processed in the second device layer DEL2 of the second die DIE2 may be transferred to the third bump BMP3 through the second metal layer MEL2 and the through contact TCNT. The third bump BMP3 may be connected to the uppermost wiring line Mt of the first metal layer MEL1 via the through contact TCNT. Therefore, the signal may be input through the first metal layer MEL1 to the first device layer DEL1. Accordingly, a signal may be exchanged and processed between the first die DIE1 and the second die DIE2.

A variation in diameter of the through contact TCNT may be the same as or similar to a variation in diameter of the through electrode TEL. The through contact TCNT may have a diameter that decreases in a direction from lower toward upper portions thereof. For example, the lower portion of the through contact TCNT in the second power delivery network PDN2 may have a fifth diameter DI5. The upper portion of the through contact TCNT in the second metal layer MEL2 may have a sixth diameter DI6. The sixth diameter DI6 may be less than the fifth diameter DI5.

Figure 10:
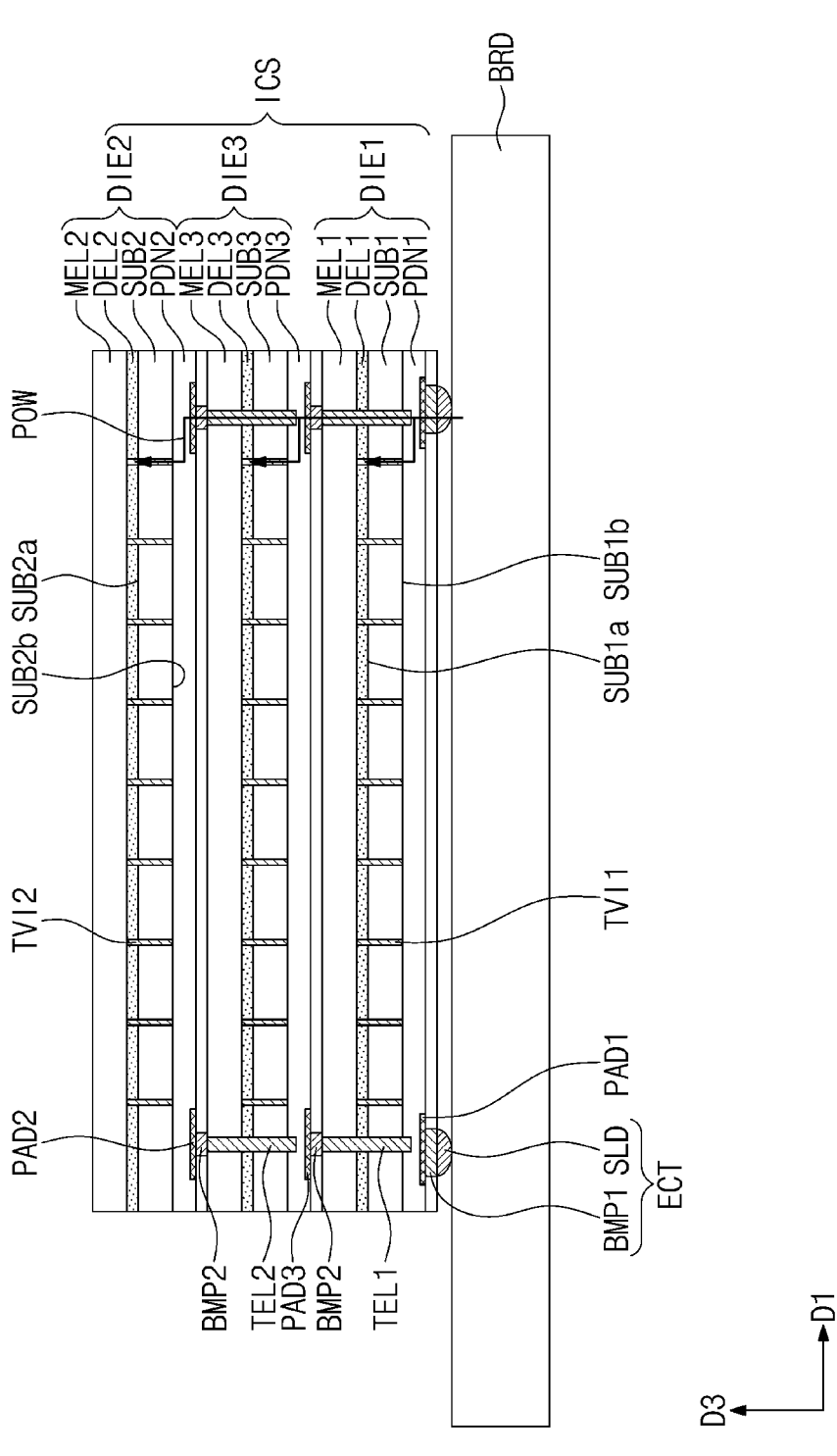
FIG. 10 illustrates a cross-sectional view showing a semiconductor package according to some embodiments of the present inventive concept.

FIG. 10 illustrates a cross-sectional view showing a semiconductor package according to some embodiments of the present inventive concept. In the embodiment that follows, a detailed description of features repetitive to those discussed above with reference to FIGS. 1 and 2 may be omitted, and a difference thereof will mainly be discussed in detail.

Referring to FIG. 10, the three-dimensional integrated circuit structure ICS according to some embodiments of the present inventive concept may further include a third die DIE3 interposed between the first die DIE1 and the second die DIE2.

The third die DIE3 may include a third power delivery network PDN3, a third substrate SUB3, a third device layer DEL3, and a third metal layer MEL3 that are sequentially stacked.

The third power delivery network PDN3, the third substrate SUB3, the third device layer DEL3, and the third metal layer MEL3 of the third die DIE3 may be respectively the same as or similar to the first power delivery network PDN1, the first substrate SUB1, the first device layer DEL1, and the first metal layer MEL1 of the first die DIE1 discussed above with reference to FIGS. 1 and 2.

The third die DIE3 may further include second through electrodes TEL2 that penetrate therethrough. The second through electrode TEL2 may be substantially the same as the through electrode TEL of the first die DIE1 discussed above with reference to FIGS. 1 and 2. The second through electrode TEL2 may extend in the third direction D3 from the third power delivery network PDN3 to a top surface of the third metal layer MEL3.

The second through electrode TEL2 may be electrically connected to the first through electrode TEL1 of the first die DIE1. For example, the first through electrode TEL1 may be electrically connected to the third power delivery network PDN3 through the second bump BMP2 and the third pad PAD3 in direct contact with the second bump BMP2. The second through electrode TEL2 may be connected to the third power delivery network PDN3, and the power POW applied to the third power delivery network PDN3 may be transferred in the third direction D3 through the second through electrode TEL2.

The second through electrode TEL2 may be electrically connected to the second power delivery network PDN2 through the second bump BMP2 and the second pad PAD2 in direct contact with the second bump BMP2. As a result, the power POW applied from the external connection member ECT to the three-dimensional integrated circuit structure ICS may be transferred in a vertical direction (e.g., the third direction D3) through the first through electrode TEL1 and the second through electrode TEL2. The first and second through electrodes TEL1 and TEL2 may be electrically connected to the first, second, and third power delivery networks PDN1, PDN2, and PDN3, and the power POW and a signal may be directly transferred to the first, second, and third device layers DEL1, DEL2, and DEL3 through the first, second, and third power delivery networks PDN1, PDN2, and PDN3.

In some embodiments of the present inventive concept, the second through electrode TEL2 may vertically overlap the first through electrode TELL. The second pad PAD2 may vertically overlap the third pad PAD3.

In some embodiments of the present inventive concept, there may be provided a plurality of third dies DIE3 that are stacked. Each of the plurality of third dies DIE3 may include the third power delivery network PDN3 and the second through electrode TEL2. Thus, the power POW may be transferred from the first die DIE1 through the stacked third dies DIE3 to the second die DIE2 at top position of the three-dimensional integrated circuit structure ICS. For example, the N number of the third dies DIE3 may be interposed between the first die DIE1 and the second die DIE2, and N may be an integer between 1 and 10.

Figure 11:
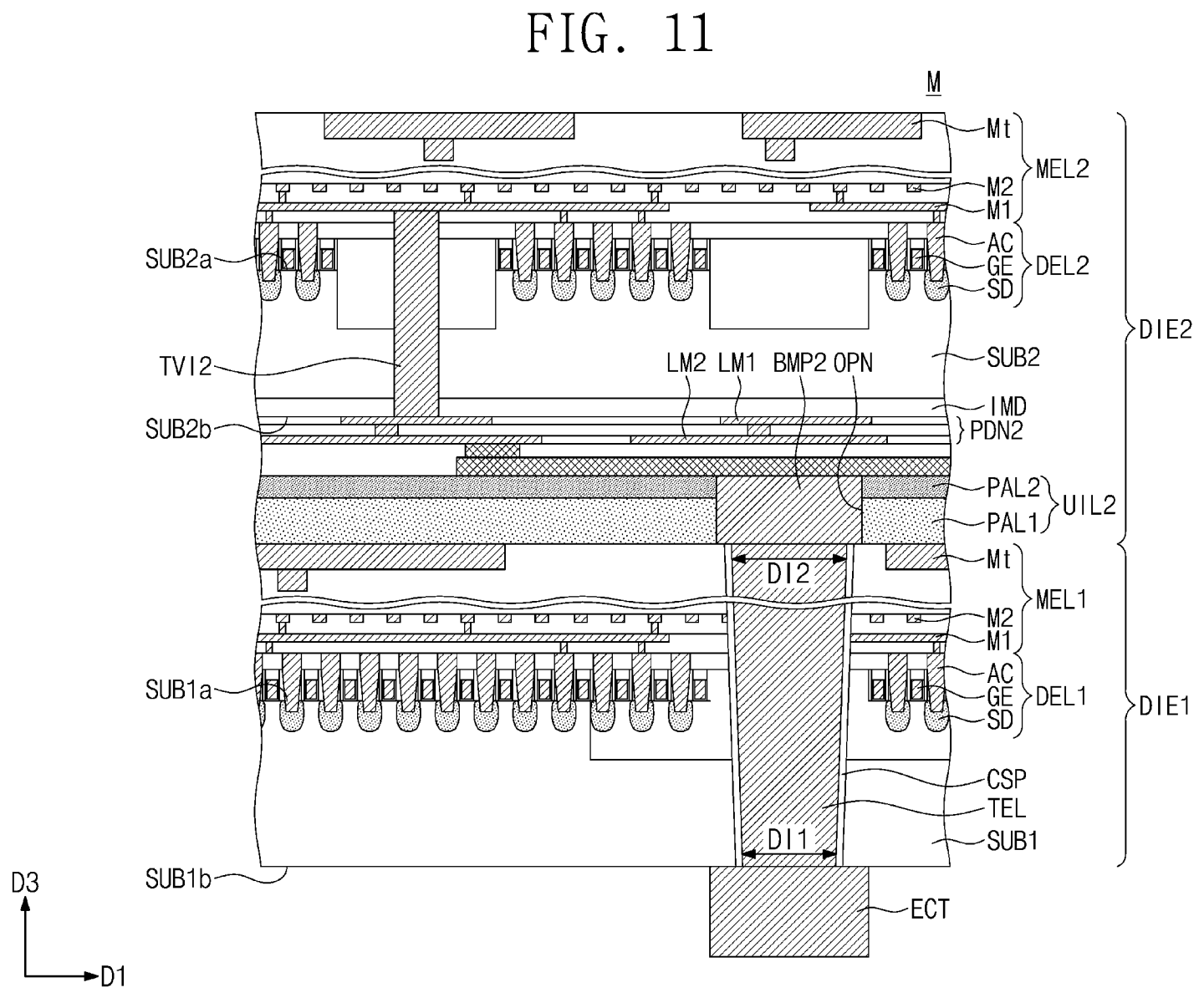
Figure 12:
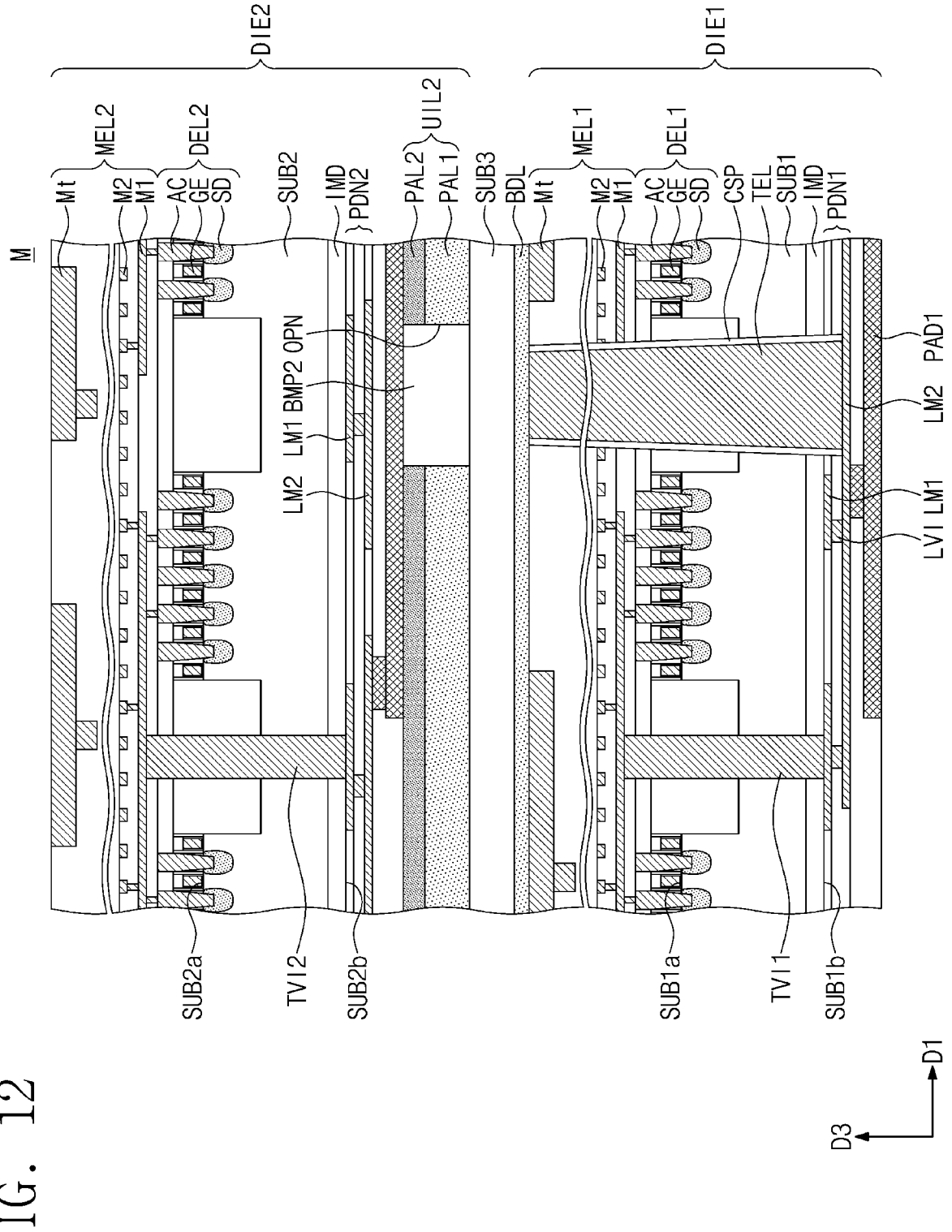
Figure 13:
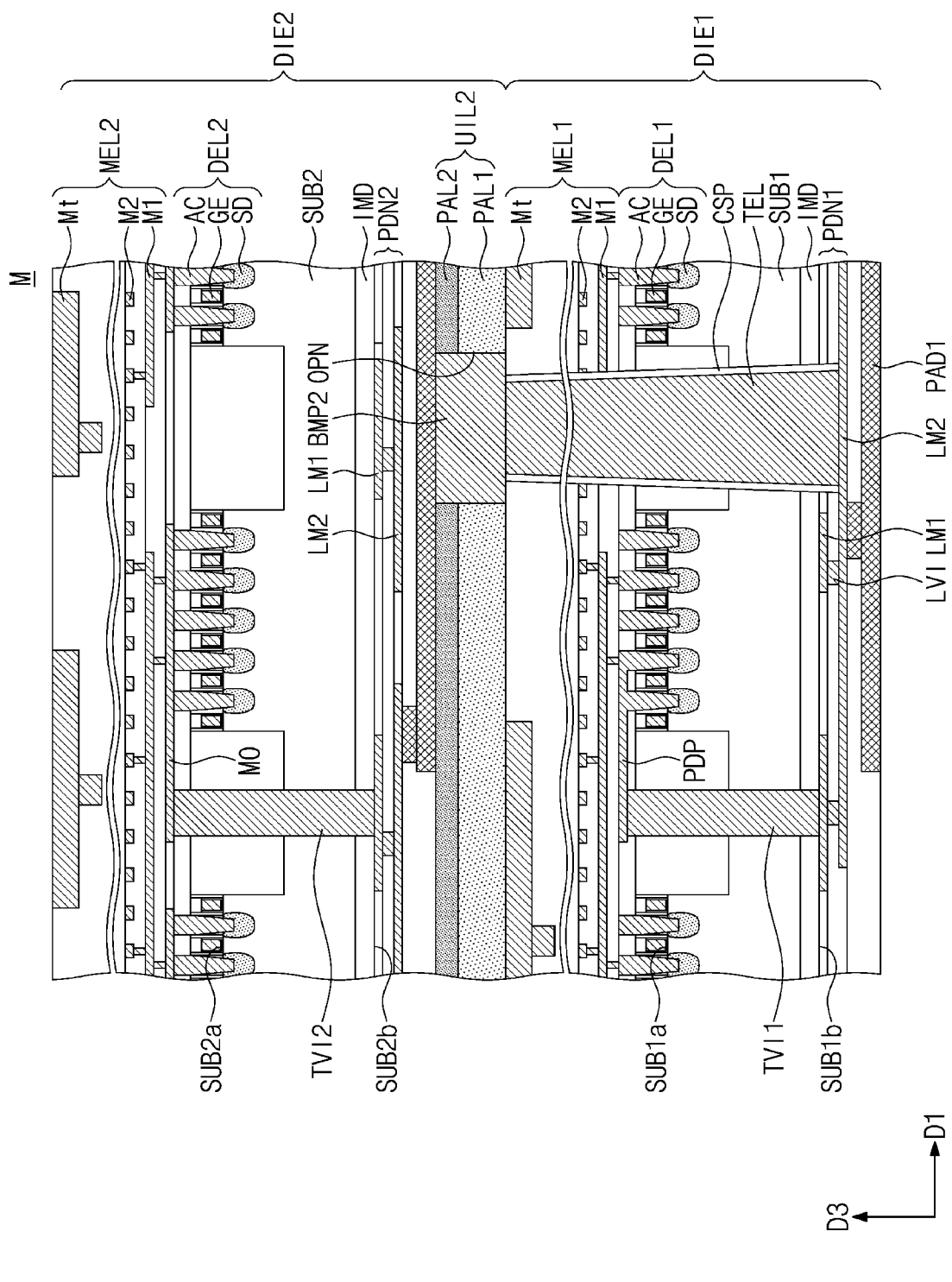

FIGS. 11, 12, and 13 illustrate enlarged cross-sectional views of section M shown in FIG. 1, showing a three-dimensional integrated circuit structure according to some embodiments of the present inventive concept. In the embodiment that follows, a detailed description of features repetitive to those discussed above with reference to FIGS. 1 and 2 may be omitted, and a difference thereof will mainly be discussed in detail.

Referring to FIG. 11, the first die DIE1 may include neither the first power delivery network PDN1 nor the first through vias TVI1. The external connection member ECT, such as a bump, may be directly provided on the second surface SUB1b of the first substrate SUB1. The through electrode TEL may directly connect the external connection member ECT to the second bump BMP2 between the first die DIE1 and the second die DIE2.

Referring to FIG. 12, a third substrate SUB3 may be interposed between the first die DIE1 and the second die DIE2. The third substrate SUB3 may be a semiconductor wafer used as a carrier substrate. For example, the third substrate SUB3 may include silicon (Si). A bonding layer BDL may be provided between the third substrate SUB3 and the first die DIE1.

Referring to FIG. 13, the active contact AC of the first die DIE1 may include a pad part PDP at an upper portion thereof. The pad part PDP may horizontally extend to overlap the first through via TVI1. The first through via TVI1 may be directly connected to the pad part PDP of the active contact AC. Therefore, a power and a signal may be directly transferred to the active contact AC from the first power delivery network PDN1.

The second die DIE2 may include a MOL line M0 between the active contact AC and the first wiring line M1. The MOL line M0 may be formed through a middle-of-line (MOL) process before the formation of the first wiring line M1. The MOL line M0 may horizontally extend to overlap the second through via TVI2. The second through via TVI2 may be directly connected to the MOL line M0. Therefore, a power and a signal may be directly transferred from the second power delivery network PDN2 to the MOL line M0 below the first wiring line Mt. As a result, there may be a reduction in path through which a power and a signal are transferred to the second device layer DEL2.

Figure 14:
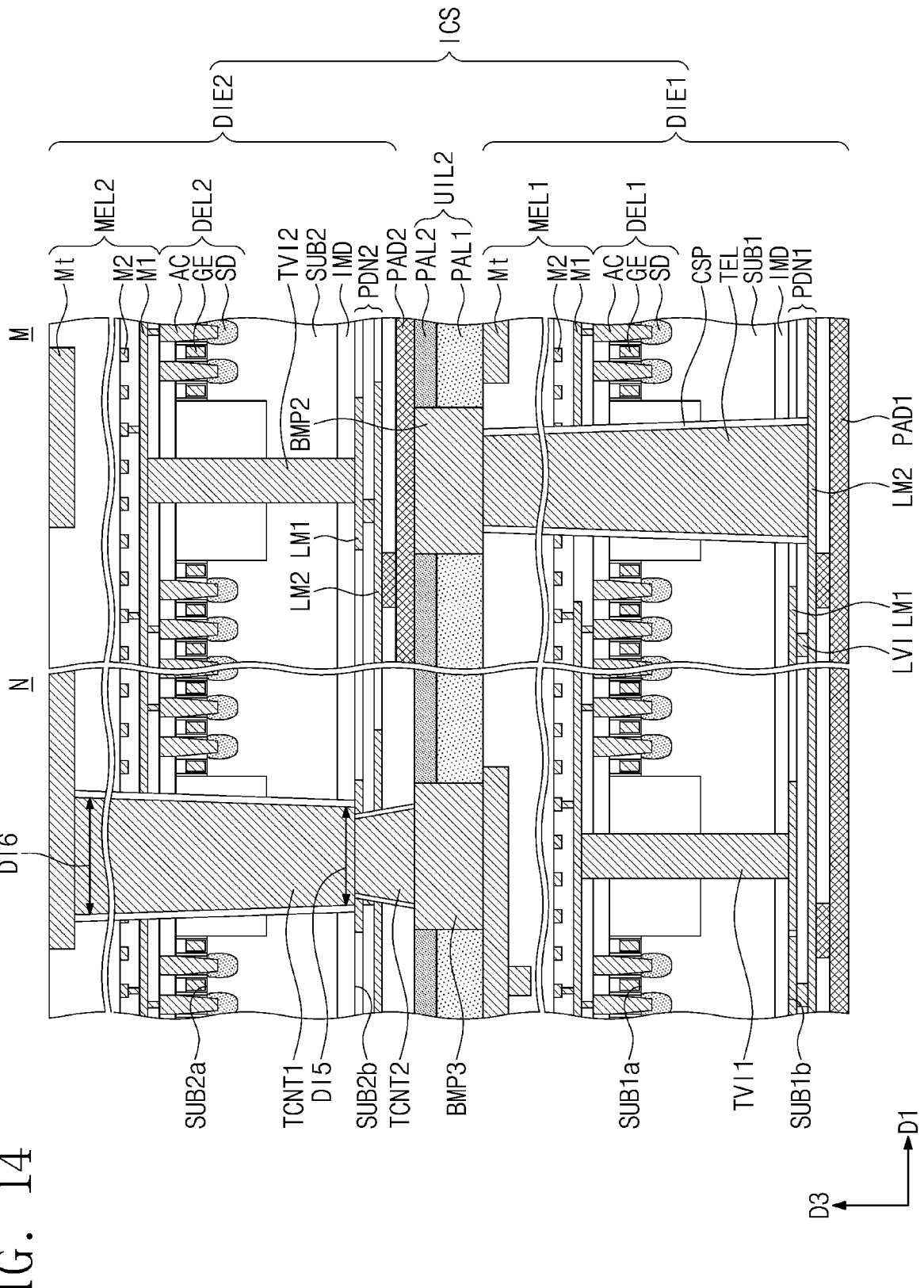
FIG. 14 illustrates enlarged cross-sectional view of sections N and M shown in FIG. 8, showing a three-dimensional integrated circuit structure according to some embodiments of the present inventive concept.

FIG. 14 illustrates an enlarged cross-sectional view of sections N and M shown in FIG. 8, showing a three-dimensional integrated circuit structure according to some embodiments of the present inventive concept. In the embodiment that follows, a detailed description of features repetitive to those discussed above with reference to FIGS. 8 and 9 may be omitted, and a difference thereof will mainly be discussed in detail.

Referring to FIG. 14, the second die DIE2 may include a first through contact TCNT1 and a second through contact TCNT2. The first through contact TCNT1 may vertically extend from the second metal layer MEL2 to the second surface SUB2b of the second substrate SUB2.

The second through contact TCNT2 may vertically extend from the second surface SUB2b of the second substrate SUB2 to a top surface of the third bump BMP3. The second through contact TCNT2 may vertically overlap the first through contact TCNT1. The second through contact TCNT2 may be connected to the first through contact TCNT1. The third bump BMP3 and the second metal layer MEL2 may be electrically connected to each other through the first and second through contacts TCNT1 and TCNT2.

A variation in diameter of the first through contact TCNT1 may be opposite to a variation in diameter of the through electrode TEL. The first through contact TCNT1 may have a diameter that increases in a direction from lower toward upper portions thereof. For example, a fifth diameter DI5 may be given to the lower portion of the first through contact TCNT1 in the second substrate SUB2. A sixth diameter DI6 may be given to the upper portion of the first through contact TCNT1 in the second metal layer MEL2. The sixth diameter DI6 may be greater than the fifth diameter DI5.

In a three-dimensional integrated circuit structure according to some embodiments of the present inventive concept, a power delivery network and its connected through electrode may be used to directly transfer an external power along the shortest path to a first device layer of a first die and a second device layer of a second die. The three-dimensional integrated circuit structure may increase in electrical properties and improve in power and signal delivery efficiency.

Although some embodiments of the present inventive concept have been described with reference to the accompanying figures, it will be understood that various changes in form and detail may be made thereto without departing from the spirit and scope of the present inventive concept as set forth in the appended claims. It therefore will be understood that the embodiments described above are illustrative and not limiting.

What is claimed is:

1. An integrated circuit structure, comprising:
   a first die including a first power delivery network, a first substrate, a first device layer, and a first metal layer that are sequentially stacked;
   a second die on the first die, the second die including a second power delivery network, a second substrate, a second device layer, and a second metal layer that are sequentially stacked;
   a first through electrode that extends from the first power delivery network to a top surface of the first metal layer;
   a first bump on the first through electrode;
   a through contact that extends from the second power delivery network to the second metal layer, is horizontally offset relative to the first through electrode and is able to transfer power; and
   a second bump between the through contact and the first metal layer,
   wherein the second metal layer is electrically connected to the first metal layer through the second bump and the through contact,
   wherein the second power delivery network includes:
      a plurality of lower lines is configured to transfer a power to the second device layer; and
      a pad connected to a lowermost one of the lower lines,
   wherein the first bump is interposed between and connects the first through electrode and the pad,
   wherein the through contact penetrates the second power delivery network,
   wherein the first power delivery network is electrically connected to the second power delivery network through the first bump and the first through electrode, and
   wherein the through contact extends to a bottom surface of the second power delivery network.

2. The integrated circuit structure of claim 1, further comprising an external connection member below the first power delivery network,
   wherein the external connection member is configured to apply the power to the first power delivery network.

3. The integrated circuit structure of claim 2, wherein the power applied to the first power delivery network is transferred to the second power delivery network through the first bump and the first through electrode.

4. The 3D integrated circuit structure of claim 1, wherein the second die further includes a through via that penetrates the second substrate and extends from the second power delivery network to the second metal layer, wherein a diameter of the first through electrode is greater than a diameter of the through via, and wherein the second power delivery network is electrically connected to the second device layer through the second metal layer and the through via.

5. The integrated circuit structure of claim 1, further comprising:

a third die between the first die and the second die, the third die including a third power delivery network, a third substrate, a third device layer, and a third metal layer that are sequentially stacked; and a second through electrode that extends from the third power delivery network to the third metal layer, wherein the first, second, and third power delivery networks are electrically connected to each other through the first through electrode and the second through electrode.

6. The integrated circuit structure of claim 5, wherein the first through electrode and the second through electrode overlap each other.

7. The integrated circuit structure of claim 1, wherein a lower portion of the first through electrode is in the first power delivery network, an upper portion of the first through electrode is in the first metal layer, and a diameter of the lower portion of the first through electrode is greater than a diameter of the upper portion of the first through electrode.

8. The integrated circuit structure of claim 1, further comprising a dielectric spacer on a sidewall of the first through electrode.

9. The integrated circuit structure of claim 1, wherein a diameter of a lower portion of the first through electrode is greater than a diameter of an upper portion of the first through electrode, and a diameter of a lower portion of the through contact is greater than a diameter at of upper portion of the through contact.

10. An integrated circuit structure, comprising:

a first die including a first power delivery network, a first substrate, a first device layer, and a first metal layer that are sequentially stacked;

a second die on the first die, the second die including a second power delivery network, a second substrate, a second device layer, and a second metal layer that are sequentially stacked:

a through electrode that extends from the first power delivery network to a top surface of the first metal layer; and a through contact that extends from the second power delivery network to the second metal layer, is horizontally offset relative to the through electrode, wherein the through contact penetrates the second power delivery network, wherein the through electrode electrically connects the first power delivery network to the second power delivery network, wherein the through contact electrically connects the first metal layer to the second metal layer, wherein a diameter of a lower portion of the through electrode is greater than a diameter of an upper portion of the through electrode, wherein a diameter of a lower portion of the through contact is greater than a diameter of an upper portion of the through contact, and wherein the through contact extends to a bottom surface of the second power delivery network.

11. The integrated circuit structure of claim 10, wherein the through electrode is configured to transfer a power between the first power delivery network and the second power delivery network, and the through contact is configured to transfer a signal between the first metal layer and the second metal layer.

12. The integrated circuit structure of claim 10, further comprising:

a first through via that penetrates the first substrate and electrically connects the first power delivery network to the first device layer; and a second through via that penetrates the second substrate and electrically connects the second power delivery network to the second device layer.

13. The integrated circuit structure of claim 12, wherein the first device layer includes:

a first transistor on the first substrate; and a first active contact that connects the first transistor to a first lowermost line of the first metal layer, wherein the first through via is connected to the first lowermost line, wherein the second device layer includes:

a second transistor on the second substrate; and a second active contact that connects the second transistor to a second lowermost line of the second metal layer, and wherein the second through via is connected to the second lowermost line.

14. The integrated circuit structure of claim 10, further comprising:

a first dielectric spacer on a sidewall of the through electrode; and a second dielectric spacer on a sidewall of the through contact.

15. An integrated circuit structure, comprising:

a first power delivery network that includes a plurality of stacked first lower lines;

a first semiconductor substrate on the first power delivery network;

a first device layer that includes a plurality of first transistors on the first semiconductor substrate;

a first metal layer that includes a plurality of first wiring lines stacked on the first device layer;

a first through via that electrically connects the first power delivery network to the first device layer;

a through electrode that extends from the first power delivery network to a top surface of the first metal layer;

a second power delivery network on the first metal layer, the second power delivery network including a plurality of stacked second lower lines;

a second semiconductor substrate on the second power delivery network;

a second device layer that includes a plurality of second transistors on the second semiconductor substrate;

a second metal layer that includes a plurality of second wiring lines stacked on the second device layer;

a through contact that extends from the second power delivery network to the second metal layer, is horizontally offset relative to the through electrode and is able to transfer power; and a second through via that electrically connects the second power delivery network to the second device layer, wherein the through contact penetrates the second power delivery network and extends to a bottom surface of the second power delivery network, wherein the second power delivery network is electrically connected to the through electrode, wherein a power applied to the first power delivery network is transferred via the through electrode to the second power delivery network, wherein the first power delivery network is configured to transfer the power to the first device layer, and wherein the second power delivery network is configured to transfer the power to the second device layer.

16. The integrated circuit structure of claim 15, wherein a diameter of the through electrode is greater than a diameter of each of the first and second through vias.

17. The integrated circuit structure of claim 15, further comprising:

a bump on the through electrode; and a pad connected to a lowermost one of the second lower lines of the second power delivery network, wherein the bump electrically connects the through electrode and the pad to each other.

18. The integrated circuit structure of claim 15, further comprising an external connection member below a lowermost one of the first lower lines of the first power delivery network, wherein the external connection member is configured to apply the power to the first power delivery network.

19. The integrated circuit structure of claim 15, wherein the first device layer includes a first active contact that connects at least one of the first transistors to a lowermost one of the first wiring lines, wherein the first through via is connected to the lowermost one of the first wiring lines, wherein the second device layer includes a second active contact that connects at least one of the second transistors to a lowermost one of the second wiring lines, and wherein the second through via is connected to the lowermost one of the second wiring lines.

* * * * *